United States Patent [19]

Ho et al.

[11] 4,017,883
[45] Apr. 12, 1977

[54] SINGLE-ELECTRODE CHARGE-COUPLED RANDOM ACCESS MEMORY CELL WITH IMPURITY IMPLANTED GATE REGION

[75] Inventors: Irving T. Ho; Jacob Riseman, both of Poughkeepsie, N.Y.

[73] Assignee: IBM Corporation, Armonk, N.Y.

[22] Filed: Sept. 24, 1973

[21] Appl. No.: 400,480

Related U.S. Application Data

[63] Continuation of Ser. No. 159,907, July 6, 1971, abandoned.

[52] U.S. Cl. .................................. 357/24; 357/23
[51] Int. Cl.² ................................... H01L 29/78
[58] Field of Search .......................... 357/24, 23

[56] References Cited
UNITED STATES PATENTS

| | | | |
|---|---|---|---|
| 3,305,708 | 2/1967 | Ditrick | 357/24 |
| 3,374,407 | 3/1968 | Olmstead | 357/24 |
| 3,533,089 | 10/1970 | Wahlstrom | 357/24 |
| 3,651,349 | 3/1972 | Kahng et al. | 357/24 |
| 3,654,499 | 4/1972 | Smith | 357/24 |

*Primary Examiner*—Edward J. Wojciechowicz
*Attorney, Agent, or Firm*—Wolmar J. Stoffel

[57] ABSTRACT

A charge-coupled random access memory cell is formed in a semiconductor body divided into three adjacent regions. The first region has an impurity diffused therein and serves alternately as a source and a drain for charge carriers. The second or gate region has a threshold voltage determined by an impurity imparted thereto by either diffusion or ion implantation. The third or storage region has a lower threshold voltage than the gate region. A single unitary metal electrode extends in superimposed relation to the second and third regions. Upon the application of potentials to the first region and the electrode, charge carriers may be stored in or removed from the third region so as to write a "1" or a "0" in the cell.

5 Claims, 15 Drawing Figures

INVENTORS
IRVING T. HO
JACOB RISEMAN

BY Martin G. Reiffin
ATTORNEY

SINGLE-ELECTRODE CHARGE-COUPLED RANDOM ACCESS MEMORY CELL WITH IMPURITY IMPLANTED GATE REGION

This is a continuation of application Ser. No. 159,907 filed July 6, 1971, now abandoned.

CROSS-REFERENCES TO RELATED APPLICATION

Application Ser. No. 159,860 filed July 6, 1971 by I. T. Ho and H. N. Yu and entitled "Single-Electrode Charge-Coupled Random Access Memory Cell" discloses and contains claims generic to the several species of the invention disclosed in the present application.

Application Ser. No. 169,961 filed Aug. 9, 1971 by N. G. Anantha and T. L. Chiu and entitled "Charge-Coupled Random Access Memory Cell" discloses a device wherein separate electrodes are provided for the gate and storage regions, respectively.

BACKGROUND OF THE INVENTION

1. Field of the Invention

This invention relates generally to random access memory cells and more particularly to charge-coupled cells wherein the presence or absence of charge carriers indicates respectively a 1 or a 0 stored in the cell. Such cells may be arranged in a matrix of word and bit lines to constitute a random access memory suitable for use in digital computers.

2. Description of the Prior Art

In accordance with the prior art as disclosed in said application Ser. No. 169,961, a charge-coupled memory cell comprises a semiconductor body divided into three adjacent regions. The first region has an impurity diffused therein and serves as a source for charge carriers which may be either holes or electrons. The second region functions as a gate between the first and third regions and has a gate electrode superimposed thereover. The third region acts as a capacitor and serves to store the charge carriers. A storage electrode extends in superimposed relation to the third region.

When it is desired to store a 1 in the cell, suitable potentials are applied to the source region and the two electrodes to cause charge carriers to flow from the source region through the gate region and into the storage region. When it is desired to store a 0 in the cell, the applied potentials are such as to prevent the flow of charge carriers so that the storage region is relatively free of carriers.

SUMMARY OF THE INVENTION

The present invention relates to a charge-coupled random access memory cell which differs from the prior art in that instead of separate gate and storage electrodes there is provided a single unitary electrode which extends in superimposed relation to both the gate and the storage regions. Control of the flow of charge to these regions is achieved by providing the gate region with a predetermined threshold voltage and the storage region with a lower threshold voltage. This difference in threshold voltages provides the required difference in surface potentials in the two regions notwithstanding the application of both regions of the same electrode voltage by the single electrode.

The difference in threshold voltages for the two regions can be obtained in a number of ways. In the present application, the technique for achieving the required difference in threshold voltages in the gate and storage regions is to impart an impurity to the gate region. This may be achieved by diffusion or by ion implantation.

There are several important advantages obtained by the use of a single unitary electrode instead of the separate gate and storage electrodes of the prior art. First, it results in a very dense cell; that is, the cell is small and compact. This lowers the cost of production by permitting more circuitry for a given silicon area. The smaller cell size also provides faster operation and shorter switching times.

Another advantage of the single electrode is that it provides a simpler cell structure. This achieves greater economy in production because it results in higher yields.

Still another advantage of the single electrode structure is that it permits the use of a simpler manufacturing process. This also results in higher yields and therefore greater economy in production.

Other advantages of the present invention are either inherent in the structure disclosed or will be apparent to those skilled in the art as the detailed description proceeds.

DESCRIPTION OF THE PREFERRED EMBODIMENTS

Figure 1:
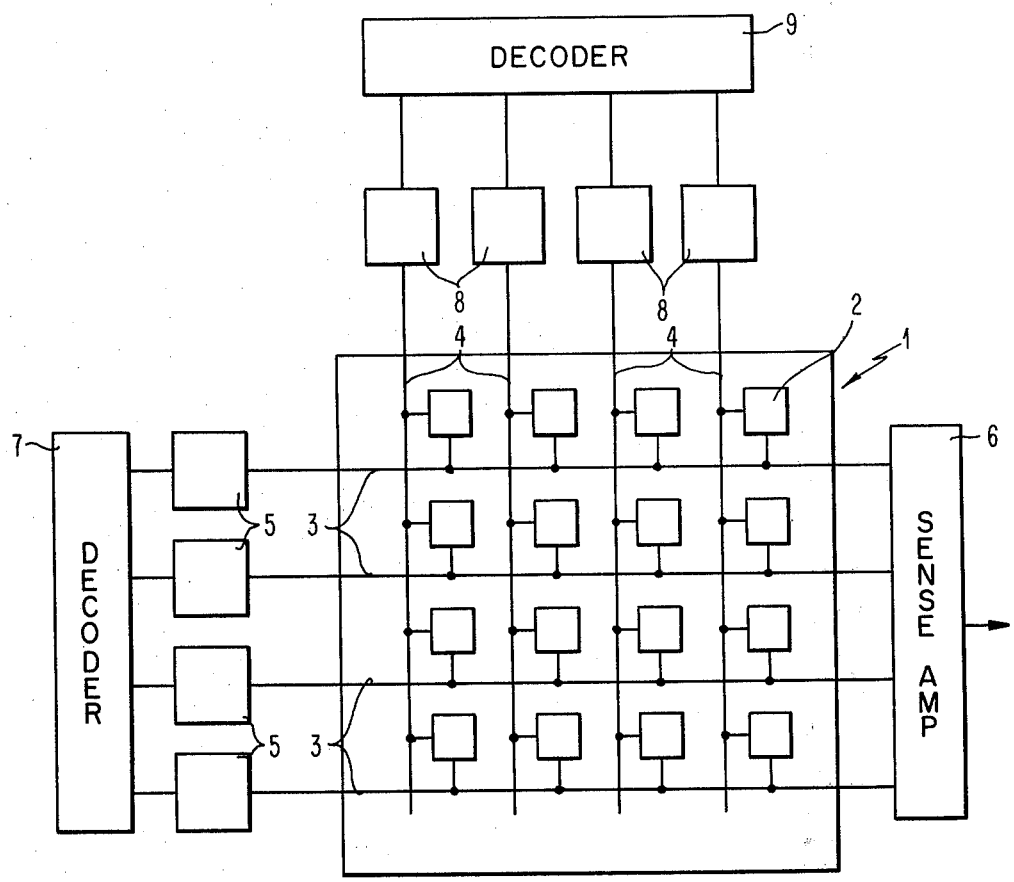
FIG. 1 is a schematic diagram showing the overall memory system embodying memory cells in accordance with the present invention.

Referring first to FIG. 1, there is shown an overall memory system embodying the novel memory cells in accordance with the present invention. The reference numeral 1 indicates generally a monolithic silicon chip in which the memory cells are formed. The cells are designated schematically at 2. Connected to the cells 2 are a series of horizontally extending bit lines 3 and a series of vertically extending word lines 4. A preamplifier 5 is connected to each of the bit lines 3 which are also connected to a set of sense amplifiers 6. A bit decoder 7 is connected to the preamplifiers 5. Each of the word lines 4 is connected to a word driver 8 to which is connected a word decoder 9.

Figure 2:
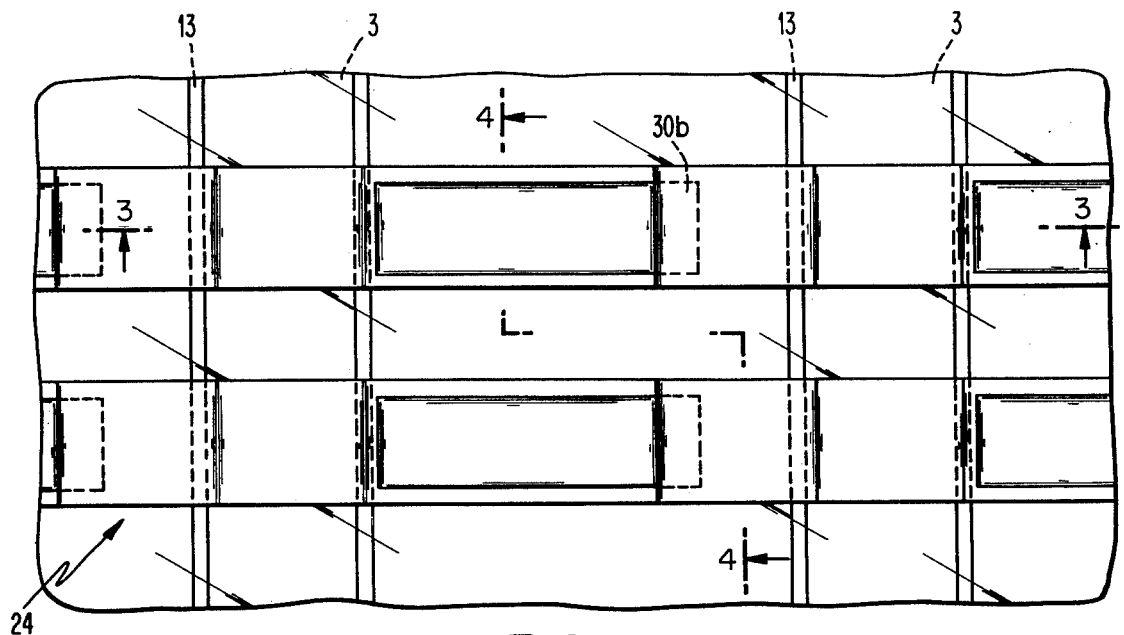
FIG. 2 is a plan view of the monolithic chip showing several of the memory cells in accordance with one embodiment of the invention.
Figure 3:
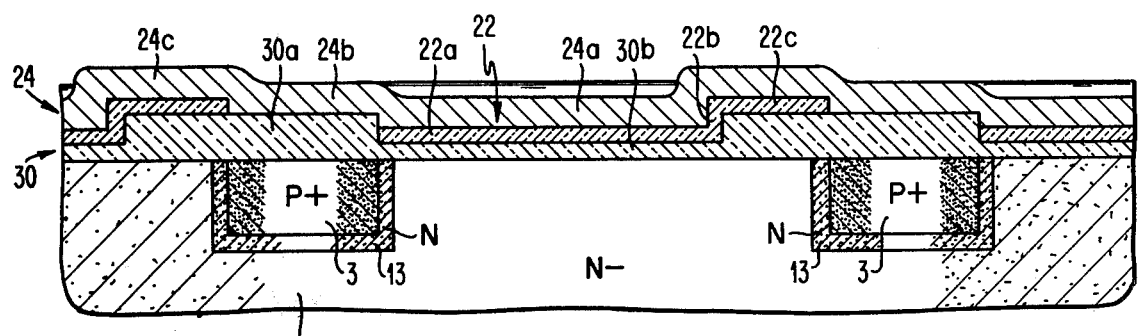
FIG. 3 is a longitudinal sectional view taken on line 3—3 of FIG. 2.
Figure 4:
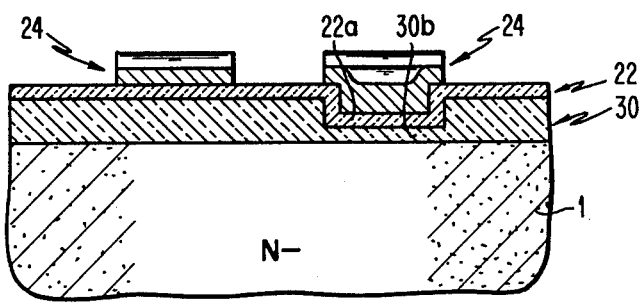
FIG. 4 is a transverse sectional view taken on line 4—4 of FIG. 2.

Referring now to FIGS. 2 to 4 inclusive, there is shown an embodiment of the invention wherein the difference in threshold voltages of the gate and storage regions is provided by a second diffusion 13 of N type material diffused through the same opening as the diffusion which forms the bit line diffusion region 3. More particularly, the reference numeral 24 designates generally a metallic word line 24 of about 10,000 A thick and provided with a lowermost horizontal portion 24a, an intermediate portion 24b, and an uppermost portion 24c.

Extending below the word line portion 24a is an insulating layer 22 of silicon nitride having at one edge an upstanding portion 22b leading to an uppermost horizontal portion 22c. The silicon nitride layer is preferably about 500 A. thick. Extending between the silicon nitride layer 22 and the upper surface of the silicon chip 1 is a relatively thin layer 30b of silicon dioxide of about 500 A thick. The silicon dioxide layer extending between the upper surface of the silicon chip 1 and the word line portions 24b, 24c is designated 30a and is about 6000 A thick.

The bit line region 3 is formed by diffusion of a P+ type impurity with an impurity concentration of about $10^{20}$ atoms per centimeter$^3$. The second diffusion 13 is of N type material with an impurity concentration of about $0.3 \times 10^{17}$ atoms per centimeter$^3$. The silicon chip 1 is of N$^-$ type material with an impurity concentration of about $5 \times 10^{15}$ atoms per centimeter$^3$. The depth of the P+ diffusion 3 is about two microns. The depth of the N diffusion 13 is about one half micron deeper than that of P+ diffusion 3.

Figure 5:
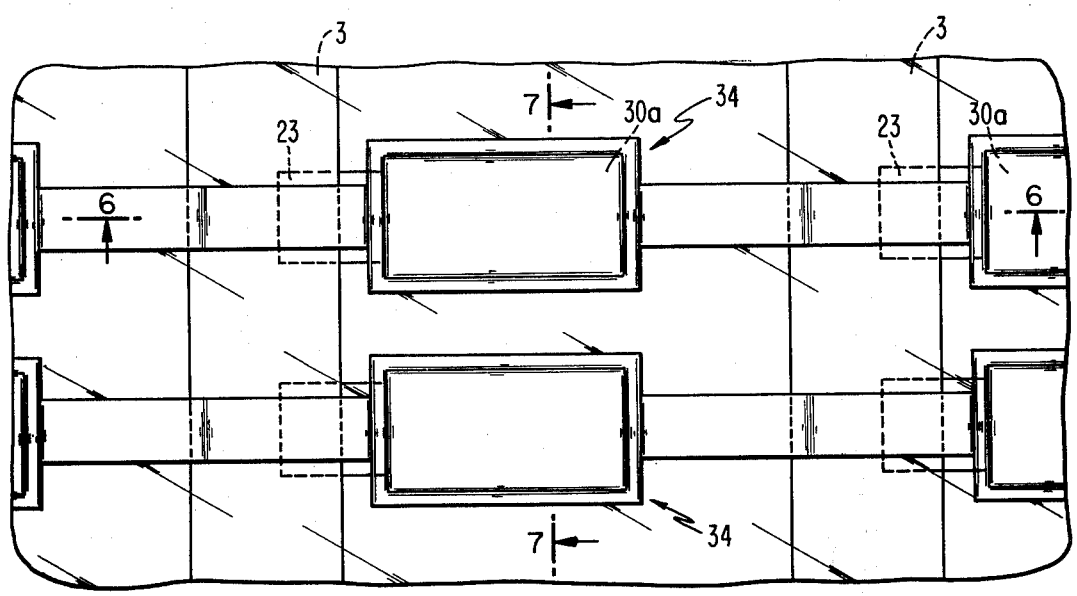
FIG. 5 is a plan view showing another embodiment of the present invention.
Figure 6:
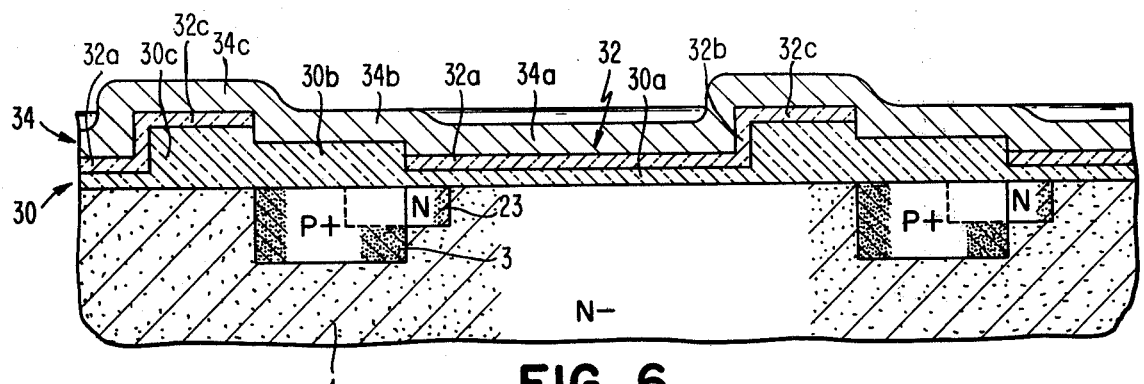
FIG. 6 is a longitudinal sectional view taken on line 6—6 of FIG. 5.
Figure 7:
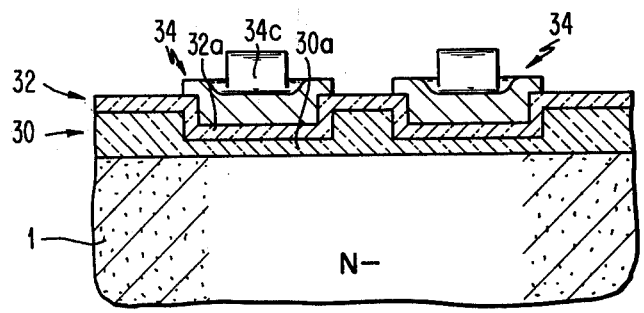
FIG. 7 is a transverse sectional view taken on line 7—7 of FIG. 5.

Referring now to FIGS. 5 to 7 inclusive, there is shown a modified form of the invention wherein the difference in threshold voltages of the gate and storage regions respectively is obtained by providing the gate region with an N type impurity material which may be achieved either by a second diffusion or preferably by ion implantation. This second diffusion or ion implantation region is designated by the reference numeral 25.

More particularly, the reference numeral 34 designates generally a metallic word line about 10,000 A thick and having a lowermost horizontal portion 34a, a stepped intermediate portion 34b, and an uppermost portion 34c. The word line portion 34a extends over the N type region 25 and over the storage region formed in the silicon chip 1. The latter is of N$^-$ type material with an impurity concentration of about $5 \times 10^{15}$ atoms per centimeter$^3$. The ion implantation region 23 is formed with an impurity concentration of about $3 \times 10^{17}$ atoms per centimeter$^3$. The impurity concentration of the diffused bit line region 3 is about $10^{20}$ atoms per centimeter$^3$.

Extending beneath the word line position 34a is an insulating layer 32a of silicon nitride about 500 A thick and having an upstanding portion 32b and an uppermost horizontal portion 32c. Between the silicon nitride layer 32a and the upper surface of the silicon chip 1 extends a relatively thin layer 30a of silicon dioxide about 500 A thick. Between the word line portion 34b and the diffused region 3, there extends a silicon dioxide layer 30b about 6000 A thick. Extending between the silicon nitride portion 32c and the upper surface of silicon chip 1 is a silicon dioxide layer 30c which is slightly thicker than the layer 30b.

The P+ bit line diffusion region 3 is formed by diffusion to a depth of slightly less than two microns. If ion implantation is used to impart an impurity to the region 23, the depth of this region is between 100 A thick and 0.5 micron. If diffusion is used to form the region 23, then the depth of the diffusion is approximately 1 micron with an average impurity concentration of $3 \times 10^{17}$ atoms per centimeter$^3$.

The term "gate region" is applied in the specification and claims to the region 23 in FIG. 6 and to the portion of region 13 in FIG. 3 which portion extends to the right of the diffused bit line region 3. The term "storage region" is applied to the upper portion of silicon chip 1 directly beneath the word line portions 24a, 34a and adjacent the respective gate region.

Referring now to FIGS. 8 to 15 inclusive, there is shown the preferred mode of operation wherein a clear pulse is employed to remove the holes from the storage region.

Figure 8:
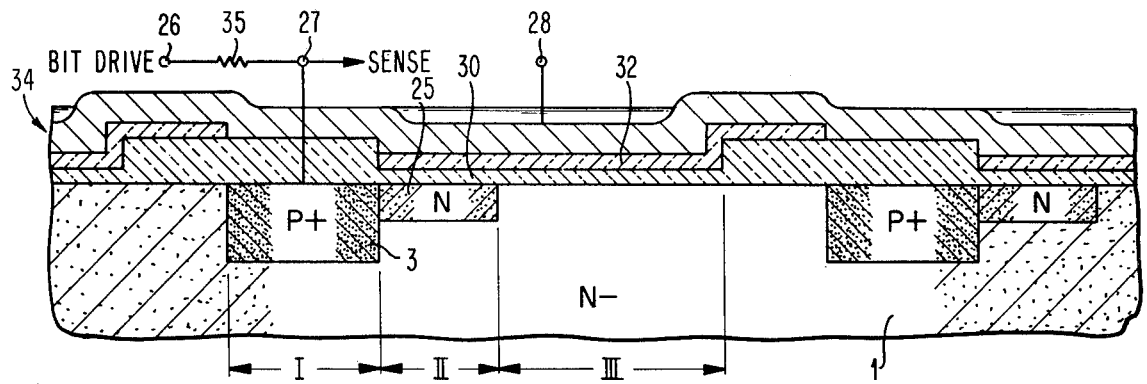
FIG. 8 is a schematic sectional view utilized in the description of the mode of operation of the present invention.

Referring first to FIG. 8, the mode of operation is shown illustrated with reference to the embodiment of FIGS. 5 to 7 wherein the same reference numerals are applied to corresponding parts. Connected to the word line 34 is a word line terminal 28. Connected to the bit diffusion region 3 is a sense output terminal 27 in series with a resistor 35 and a bit drive terminal 26. The lateral dimensions of the diffusion, gate and storage regions are indicated by the dashed vertical lines and the respective Roman numerals I, II and III.

Figure 9:
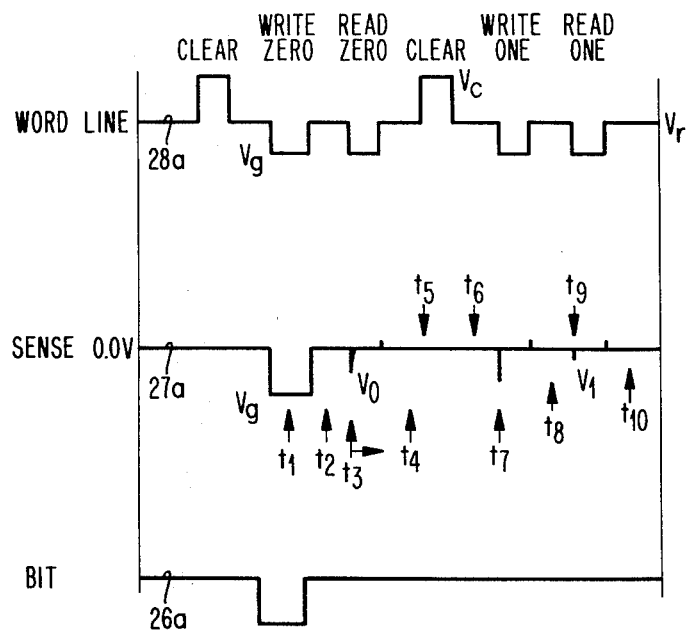
FIG. 9 is a schematic view showing a set of waveforms utilized in describing said mode of operation.

Referring to FIG. 9, there are shown the waveforms 28a, 27a and 26a of the voltages at the word line terminal 28, sense output terminal 27 and bit drive terminal 26, respectively.

Figure 10:
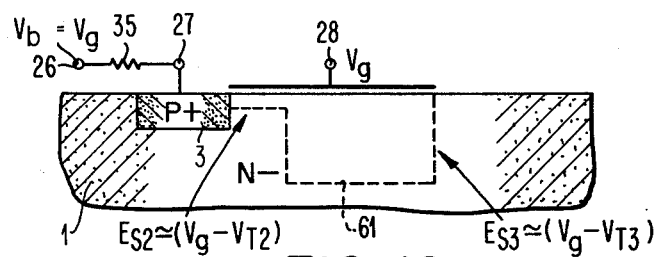
FIG. 10 is a schematic diagram showing the applied voltages and surface potentials during the "write zero" operation.

Referring now to FIG. 10, there are shown the applied voltages and resulting surface potentials at the time $t_1$ during a write zero operation. As shown by waveform 28a in FIG. 9, the voltage $v_b$ applied to bit drive terminal 26 is designated $V_g$ and is about $-7$ volts. The voltage applied to the word line terminal 28 is also $V_g$ at about $-7$ volts. The magnitude of the resulting potential at the surface of silicon chip 1 is indicated by the dashed line at 61. It will be seen that the surface potential $E_{S2}$ in the second or gate region is equal to $V_g - V_{T2}$ where $V_{T2}$ is the threshold voltage of the second or gate region. The surface potential $E_{S2}$ in the gate region is therefore about $-1$ volt. $E_{S3}$ is the surface potential in the third or storage region and is equal to about $V_g - V_{T3}$. This is about $-6$ volts. These applied voltages and resulting surface potentials result in an electric field represented by an electric field intensity vector extending from right to left as viewed in FIG. 10. As a result, no holes flow from the diffused region 3 into the gate or storage region, and there results the write zero operation.

Figure 11:
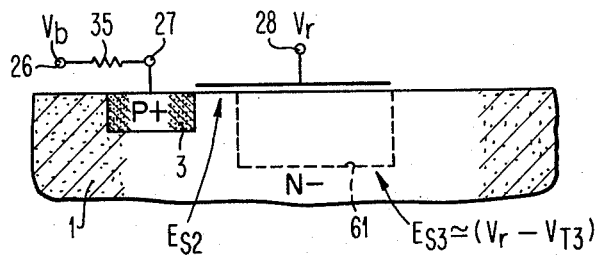
FIG. 11 is a schematic diagram showing the applied voltages and surface potentials during the "store zero" operation.

Referring now to FIG. 11, there are shown the applied voltages and resulting surface potentials at time $t_2$ during the operation of storing a zero. The bit drive voltage $V_b$ applied to the bit drive terminal 26 is zero volts. The voltage applied to the word line terminal 28 is $V_r$ at about −5 volts. The resulting surface potential $E_{S2}$ in the second or gate region is zero volts, and the resulting surface potential $E_{S3}$ is indicated by the dashed lines at 61 and is −4 volts. It will be seen that as a result of these voltages and potentials, no holes flow and the storage region is maintained free of holes so as to store a zero.

Figure 12:
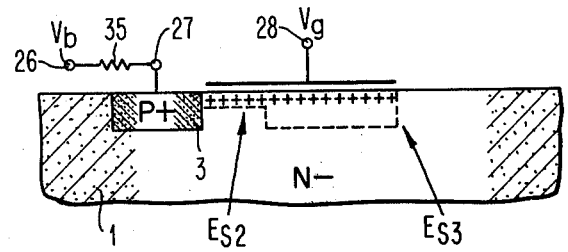
FIG. 12 is a schematic diagram showing the applied voltages and surface potentials during the "read zero" operation.

Referring to FIG. 12, there are shown the applied voltages and resulting surface potentials at time $t_3$ during the operation of reading a zero. The bit drive voltage $V_b$ applied to the terminal 26 is zero volts and the voltage applied to the word line terminal 28 is $V_g$ at about −7 volts. The surface potentials $E_{S2}$ and $E_{S3}$ in the gate and storage regions respectively is about −1 volts, due to the flow of holes into the gate and storage regions as shown by the + symbols. This flow of holes results in a current through resistor 35 so as to result in a sharp negative pulse at the sense output terminal 27 as shown at $V_O$ in waveform 27a of FIG. 9. This negative pulse $V_O$ indicates a reading of a zero.

Figure 13:
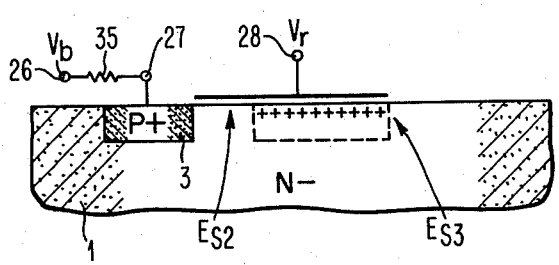
FIG. 13 is a schematic diagram showing the applied voltages and surface potentials before the "clear" operation.

Referring to FIG. 13, there are shown the applied voltages and resulting surface potentials at time $t_4$ before the clear operation. The voltage $V_b$ applied to the bit drive terminal 26 is zero volts and the voltage $V_r$ applied to the word line terminal 28 is −4 volts. The resulting surface potential $E_{S2}$ in the gate region is equal to zero and the resulting surface potential $E_{S3}$ in the storage region is equal to −1 volt. It will be seen that the holes indicated by the + symbols remain stored in the storage region until they are removed by the clear operation.

Figure 14:
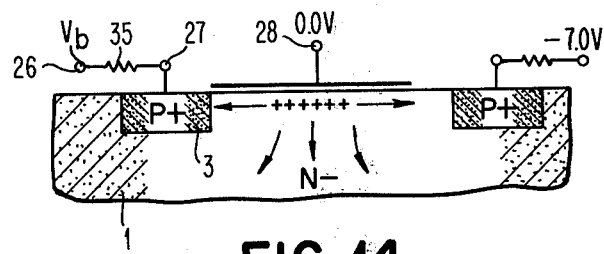
FIG. 14 is a schematic diagram showing the applied voltages and flow of charge carriers during the clear operation.

Referring to FIG. 14, there are shown the applied voltages and resulting surface potentials at time $t_5$ during the clear operation. The voltage $V_b$ applied to the bit drive line 26 is −7 volts and the voltage applied to the word line terminal 28 is zero volts. The holes diffuse outwardly from the storage region in the directions indicated by the arrows in FIG. 14.

Figure 15:
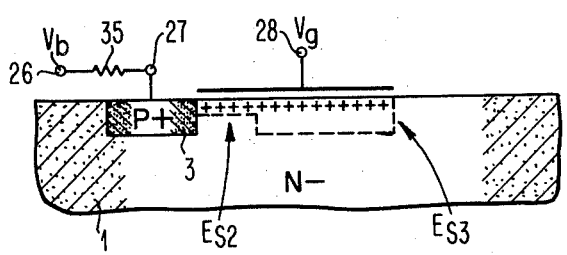
FIG. 15 is a schematic diagram showing the applied voltages and surface potentials during the "read one" operation.

Referring to FIG. 15, there are shown the applied voltages and resulting surface potentials at time $t_9$ during the read one operation. The voltage $V_b$ applied to the bit drive line 26 is zero volts and the voltage $V_g$ applied to the word line terminal 28 is −7 volts. The surface potential $E_{S2}$ in the gate region is about −1 volt and the surface potential $E_{S3}$ in the storage region is also about −1 volt. It will be seen that the holes indicated by the + symbols remain stored in the gate and storage regions so that no substantial current flows through the resistor 35. There appears on the bit sense line 27 only a slight voltage pulse $V_1$ due to capacitance effects. The absence of a large pulse such as at $V_0$ during the read zero operation, designates the reading of a one.

At time $t_6$ after the clear operation, the applied voltages and surface potentials are the same as at time $t_2$ as shown in FIG. 11. At time $t_7$ during the "write one" operation the applied voltages and resulting surface potentials are the same as at time $t_3$ as shown in FIG. 12. At time $t_8$ during the operation of storing at a one, the applied voltages and resulting surface potentials are the same as at time $t_4$ as shown in FIG. 13. At time $t_{10}$ before the clear operation, the applied voltages and resulting surface potentials are the same as at time $t_4$ as shown in FIG. 13.

It is to be understood that the various embodiments disclosed herein are merely illustrative of several of the many forms which the invention may take in practice without departing from the scope of the invention as delineated in the appended claims, and that numerous modifications thereof will readily occur to those skilled in the art. The claims are to be construed as broadly as permitted by the prior art.

We claim:

1. A charge coupled random access memory array comprising:

a semiconductor body having embodied therein an impurity of a first conductivity type, a plurality of charge coupled memory cells arranged in columns and rows on said body, bit lines extending in the column direction, each bit line in operative relation to a column of said cells, word lines extending in the row direction, each word line in operative relation to a row of said cells, each of said cells comprised of a first region in said semiconductor body formed of an impurity of a second opposite conductivity type, said first region of said cell in operative electrical connection with one of said bit lines, a second region in said body in adjacent lateral relationship to said first region in the row direction and having embodied therein an impurity of a first conductivity type in a concentration greater than the concentration of the impurity in said semiconductor body, a third region in said body in adjacent lateral relationship to said second region, and spaced from said first region by said second region and having embodied therein an impurity of a first conductivity type in a concentration less than the concentration in said second region, said third region spaced from the first region of the adjacent memory cell, the threshold voltage of said second region being higher in absolute magnitude than the threshold voltage of said third region, the threshold voltages of said second and third regions being determined at least in part by the relative impurity concentrations in said second and third regions, a surface layer of dielectric material overlying at least said second region and said third region, a single conductive electrode on said surface layer of dielectric material and extending over said second and third regions in superimposed relation and in operative electrical connection with one of said word lines, said electrode having a first portion over said second region of said body and a second portion over said third region of said body, a means of applying at least two voltage levels to said conductive electrode to control the storage of charges in, and flow of charges to, said third region, the first of said voltage levels applied to said conductive electrode is of an absolute magnitude less than said first predetermined threshold voltage of said second region, but equal to or greater than said second threshold voltage of said third region, thereby inverting only said third region for charge storage capability, the second of said voltage levels of an absolute magnitude equal to or greater than said first predetermined threshold voltage of said second region thereby inverting both of said second and third regions for charge flow capability.

2. A charge-coupled random access memory array as recited in claim 1 and comprising means for sensing the charge stored in said third region.

3. A charge-coupled random access memory array as recited in claim 1 wherein said impurity in the second region is diffused therein.

4. A charge-coupled random access memory array as recited in claim 1 wherein said impurity in the second region is obtained therein by ion implantation.

5. A charge coupled random access memory array as recited in claim 1 comprising
 a preamplifier and a sense amplifier connected to each of said bit lines,
 a decoder connected to said preamplifiers,
 a word driver connected to each of said word lines, and
 a decoder connected to said word drivers.

* * * * *